(12) United States Patent
Hwang et al.

(10) Patent No.: US 7,002,872 B2
(45) Date of Patent: Feb. 21, 2006

(54) SEMICONDUCTOR MEMORY DEVICE WITH A DECOUPLING CAPACITOR

(75) Inventors: Hyong-ryol Hwang, Seoul (KR); Young-hun Seo, Dac-shi (KR); Jae-yoon Sim, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 10/676,996

(22) Filed: Sep. 30, 2003

(65) Prior Publication Data

US 2004/0141398 A1    Jul. 22, 2004

(30) Foreign Application Priority Data

Jan. 22, 2003    (KR)    ..................... 10-2003-0004196

(51) Int. Cl.
    *G11C 8/00*    (2006.01)

(52) U.S. Cl. ................. 365/230.03; 365/182; 365/183; 365/230.08; 365/206

(58) Field of Classification Search ........... 365/230.03, 365/182, 183, 230.08, 206
See application file for complete search history.

(56) References Cited

U.S. PATENT DOCUMENTS

| | | | | |
|---|---|---|---|---|
| 4,980,799 A | * | 12/1990 | Tobita | ........................ 361/311 |
| 5,030,859 A | * | 7/1991 | Ihara | .......................... 307/530 |
| 5,173,875 A | * | 12/1992 | Komatsu et al. | ........ 365/189.01 |
| 6,160,747 A | | 12/2000 | Brox et al. | |
| 6,337,823 B1 | | 1/2002 | Seo et al. | |

FOREIGN PATENT DOCUMENTS

KR    10-0268745    10/2000

* cited by examiner

*Primary Examiner*—Connie C. Yoha
(74) *Attorney, Agent, or Firm*—Marger Johnson & McCollom, P.C.

(57) ABSTRACT

A semiconductor memory device includes a core block having sub-arrays and sense amplifier regions. First and second charge storing regions are disposed at sides of the core block. First and second decoupling capacitors are formed at the first and second charge storing regions, respectively. A plurality of first voltage supply lines are disposed to supply a power supply voltage to the sense amplifier regions and are connected to one electrode of each of the first and second decoupling capacitors. A plurality of second voltage supply lines are disposed to supply a ground voltage to the sense amplifier regions and are connected to the other electrode of each of the first and second decoupling capacitors.

42 Claims, 7 Drawing Sheets

{ A : When a decoupling capacitor is not used
{ B : When a decoupling capacitor is used

SEMICONDUCTOR MEMORY DEVICE WITH A DECOUPLING CAPACITOR

This application claims priority from Korean Patent Application No. 2003-04196, filed on Jan. 22, 2003, the contents of which are incorporated by reference in their entirety.

FIELD OF THE INVENTION

The present invention relates to a semiconductor memory device and, more particularly, to a random access memory device with a decoupling capacitor.

BACKGROUND OF THE INVENTION

A semiconductor memory device includes a memory cell array for storing data information. Data, e.g. 0 or 1, is written in or read out from each memory cell of the array. Read and write operations can be carried out by a read means and a write means, respectively, or by one read/write means depending on a semiconductor memory device. In the case of DRAM devices, for example, read and write operations are carried out through a well-known sense amplifier. In the case of SRAM devices, a read operation is carried out by a sense amplifier and a write operation is carried out by a write driver.

An example of a sense amplifier in a DRAM device is disclosed in U.S. Pat. No. 6,337,823 entitled RANDOM ACCESS MEMORY DEVICE CAPABLE OF MINIMIZING SENSING NOISE. An example of a sense amplifier in a SRAM device is disclosed in U.S. Pat. No. 6,160,747 entitled SEMICONDUCTOR MEMORY WITH AUTO-TRACKING BIT LINE PRECHARGE SCHEME.

Read and write operations consume larger current amounts. This large current consumption decreases a power supply voltage and increases a ground voltage creating a power noise when performing a read or write operation. More particularly, a sensing margin is reduced because of the power noise, decreasing operating speed. Decreasing the operating speed may further drain the power supply voltage.

SUMMARY OF THE INVENTION

It is an object of the present invention to address the disadvantages associated with prior art semiconductor devices.

It is another object of the invention to provide a semiconductor memory device capable of reducing power noise.

It is yet another object of the invention to provide a semiconductor memory device capable of improving operating speed.

It is yet another object of the invention to provide a decoupling capacitor for a semiconductor memory device.

A semiconductor memory device comprises a core block including a plurality of sub-arrays and a plurality of sense amplifier regions. A plurality of first voltage supply lines is capable of supplying a first operating voltage to the plurality of sense amplifier regions. A plurality of second voltage supply lines is capable of supplying a second operating voltage to the sense amplifier regions. And a charge storing region is arranged at one side of the core block and includes charge storing means connected to the first and second voltage supply lines.

BRIEF DESCRIPTION OF THE DRAWINGS

A more complete appreciation of the present invention and many of the attendant advantages thereof, will become readily apparent as the same becomes better understood by reference to the following detailed description when considered in conjunction with the accompanying drawings in which like reference symbols indicate the same or similar components.

DESCRIPTION OF THE PREFERRED EMBODIMENT

The preferred embodiment of the invention will be more fully described with reference to the attached drawings. A semiconductor memory device of the present invention will be described using a DRAM device. A person of reasonable skill should realize the present invention is not limited to the DRAM device but encompasses any type of semiconductor memory technology. Lines for supplying a power supply voltage and a ground voltage can be named by various terms. For example, such lines can be named voltage lines, voltage supply lines, distribution lines, or the like. Here, a line for supplying a power supply voltage are termed voltage supply lines for simplicity.

Figure 1:
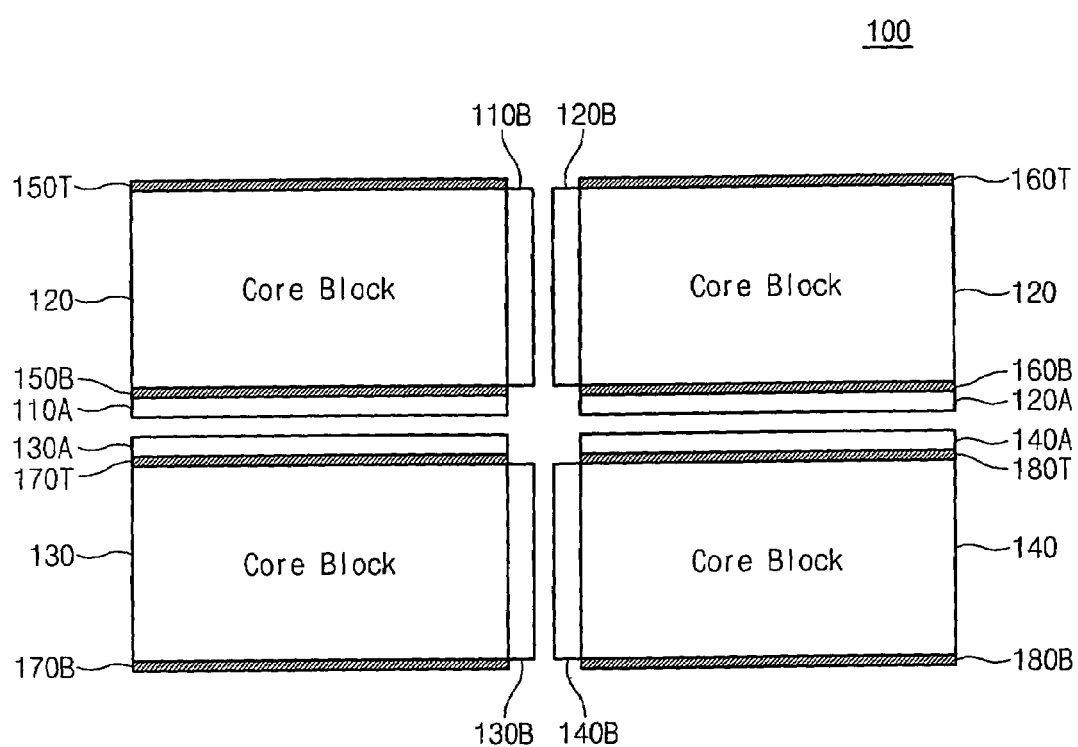
FIG. 1 is a block diagram of a semiconductor memory device according to a first embodiment of the present invention.

FIG. 1 is a block diagram of a semiconductor memory device according to a first embodiment of the present invention. Referring to FIG. 1, a semiconductor memory device 100 of the present invention comprises a plurality of, core blocks, e.g. blocks 110, 120, 130, and 140, arranged in a matrix shape. A row selector block is disposed at one side and a column selector block is disposed at the other side of a corresponding core block. For example, a row selector block 110A is disposed at a bottom side of a core block 110 and a column selector block 110B is disposed at a right side of the block 110. A row selector block 120A is disposed at a bottom side of a core block 120 and a column selector block 120B is disposed at a left side thereof. A row selector block 130A is disposed at a top side of a core block 130 and a column selector block 130B is disposed at a right side thereof. A row selector block 140A is disposed at a top side of a core block 140 and a column selector block 140B is disposed at a left side thereof. Although not shown in FIG. 1, a peripheral circuit block may be arranged between the core blocks 110 and 120 and the core blocks 130 and 140.

Charge storing regions are arranged at both sides (that is, bottom and top sides) of each core block, respectively. For example, charge storing regions 150T and 150B are laid out at upper and lower sides of a core block 110, respectively. Charge storing regions 160T and 160B are laid out at top and bottom sides of a core block 120, respectively. Charge storing regions 170T and 170B are laid out at top and bottom sides of a core block 130, respectively. Charge storing regions 180T and 180B are laid out at top and bottom sides of a core block 140, respectively. A decoupling capacitor for preventing a power noise caused at a sensing operation is formed at each charge storing region. Since a charge storing region is formed along the top and bottom side of a core block, it is possible to form a decoupling capacitor of a considerably large size. As a charge storing means, a decoupling capacitor will be connected to voltage supply lines for supplying operating voltages to sense amplifiers. This will be described below.

Charges consumed at a sensing operation are firstly supplied from a decoupling capacitor and then supplied from a power supply circuit (or externally) through voltage supply lines. In the case that no decoupling capacitor exists, consumed charges are supplied only from voltage supply lines. It is difficult to supply instantaneously consumed current to sense amplifiers without delay. This is because of voltage supply line loading. On the other hand, decoupling capacitor is used as an auxiliary power supply device, instantaneously consumed current is firstly and quickly supplied from the decoupling capacitor. Accordingly, the power noise caused by a decrease in the power supply voltage and an increase in a ground voltage can be effectively prevented or suppressed.

Figure 2:
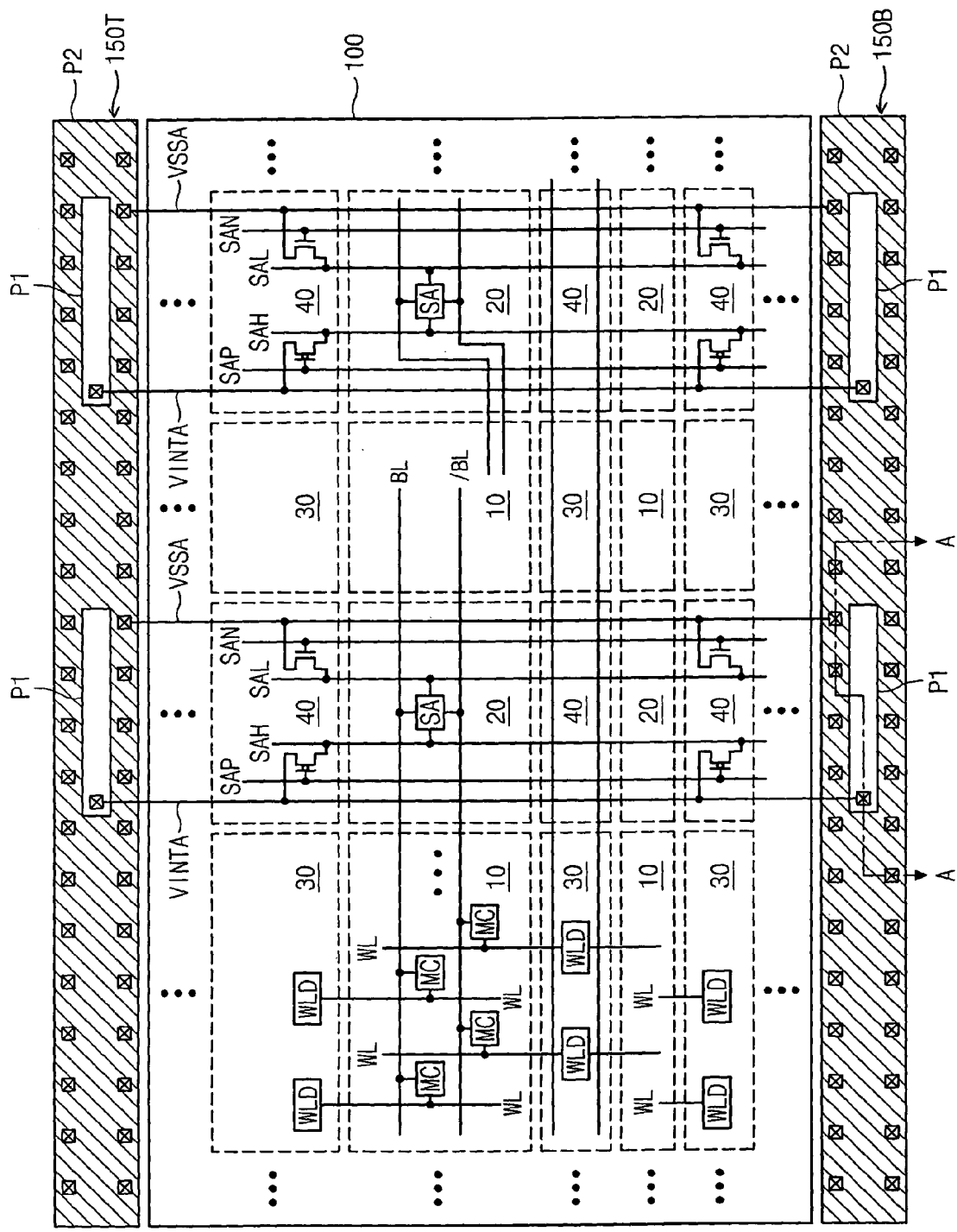
FIG. 2 is a layout diagram of the core block and the decoupling capacitor shown in FIG. 1.

FIG. 2 is a layout structure of a core block and a charge storing region shown in FIG. 1. Since core blocks in FIG. 1 have the same structure, only one core block 110 is illustrated in FIG. 2. Further, since decoupling capacitors formed at charge storing regions are formed similarly, only two charge storing regions 150T and 150B related to one core block 110 are shown in FIG. 2.

Referring to FIG. 2, a core block 110 comprises a plurality of sub-arrays 10 arranged in a matrix of rows and columns. Each sub-array 10 includes a plurality of word lines WL, a plurality of bit line pairs BL and /BL, and a plurality of memory cells MC arranged at intersections of the word lines and the bit lines. Sense amplifier regions 20 are disposed between sub-arrays 10 adjacent in each column direction. A plurality of sense amplifiers SA is provided at each sense amplifier region 20 and is connected to bit line pairs BL and /BL, arranged along the same column of each of adjacent sub-arrays 10. That is, sense amplifiers SA in each sense amplifier region 20 are shared by adjacent sub-arrays 10.

Word line driving regions 30 are disposed at both sides of respective sub-arrays 10 in each row. A plurality of word line drivers WLD are provided at each word line driving region 30. A part of word lines in each sub-array is selected by drivers WLD of a word line driving region laid out at one side, and the other thereof is selected by drivers WLD of a word line driving region laid out at the other side. Conjunction regions 40 are laid out between word line driving regions 30 adjacent in a column direction.

A voltage supply line VINTA and a voltage supply line VSSA are laid out over sense amplifier and conjunction regions 20 and 40 in each row. The voltage supply line VINTA supplies a power supply voltage to the sense amplifiers 20. The voltage supply line VSSA supplies a ground voltage to sense amplifiers 20. Although not shown in FIG. 2, the VINTA and VSSA lines may be connected to a power pad (not shown) supplied with an external power supply voltage or to an internal power supply circuit (not shown). A voltage supply line VINTA in each row is connected to a signal line SAH via PMOS transistors disposed at conjunction regions 40 and connected in common to a signal line SAP. A voltage supply line VSSA in each row is connected to a signal line SAL via NMOS transistors disposed at conjunction regions 40 and connected in common to a signal line SAN. As shown in FIG. 2, the signal lines SAH and SAL are connected to sense amplifiers SA of each sense amplifier region 20. With this structure, a power supply voltage as a first operating voltage and a ground voltage as a second operating voltage are supplied to sense amplifiers of each sense amplifier region.

A first end of voltage supply line VINTA is connected to a charge storing region 150T laid out at the top side of a core block 110. A second end of the VINTA is connected to a charge storing region 150B laid out at the bottom side of the core block 110. A first end of the voltage supply line VSSA is connected to the charge storing region 150T and a second end thereof is connected to the charge storing region 150B. Decoupling capacitors are formed at the charge storing regions 150T and 150B, respectively.

Each decoupling capacitor includes an active region, first conductive films P1 formed over the active region, and a second conductive film P2 formed over the active region. In one embodiment, the first conductive films P1 are a polysilicon forming a gate of a MOS transistor. The second conductive film P2 is a polysilicon forming a bit line. One end of a voltage supply line VINTA in each row is connected to the first conductive film P1 of the charge storing region 150T via a contact (formed between a metal and a polysilicon layers), and the other end thereof is connected to the first conductive film P1 of the charge storing region 150B via a contact. One end of a voltage supply line VSSA in each row is connected to the second conductive film P2 of the charge storing region 150T via a contact, and the other end thereof is connected to the second conductive film P2 of the charge storing region 150B via a contact. A second conductive film P2 of the charge storing region 150T is electrically connected to the active region via contacts (formed between a polysilicon and the active region). A second conductive film P2 of the charge storing region 150B is electrically connected to the active region via contacts (formed between a polysilicon and the active region). In one embodiment, the first conductive films P1 form one electrode of the decoupling capacitor and the second conductive film P2 forms the other electrode of the decoupling capacitor.

In one embodiment, only one conductive film P1 can be formed at each charge storing region and only one voltage supply line VINTA can be connected to the conductive film P1. A plurality of first conductive films are connected to a voltage supply line VINTA.

Figure 8:
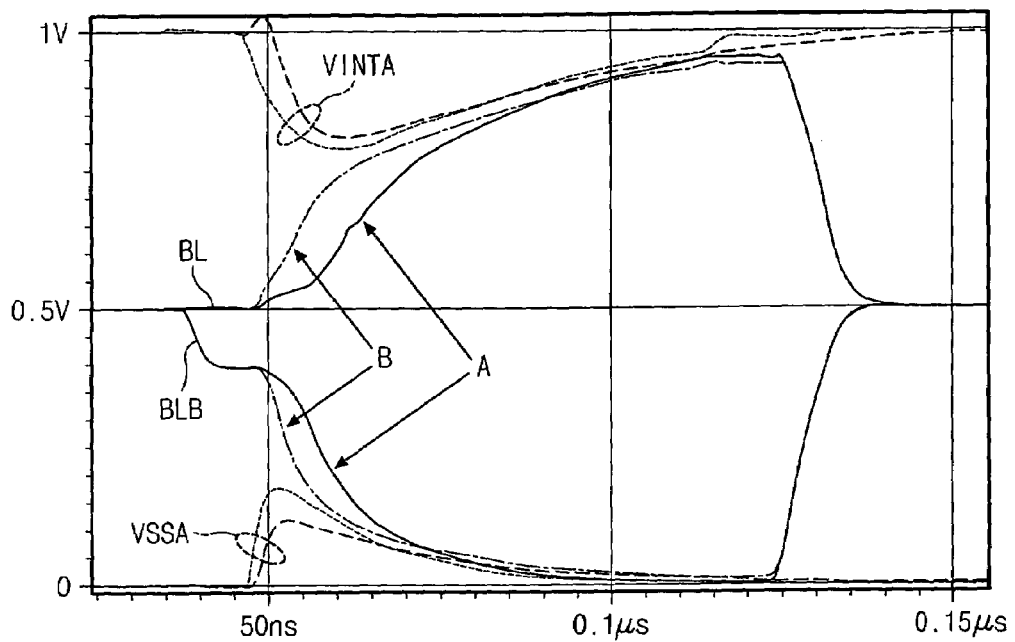
FIG. 8 is a bit line voltage variation according to the present invention.

Since a considerably large capacity decoupling capacitor is formed at each top and bottom sides of a core block 110, the power noise caused at a sensing operation is effectively reduced. As the power noise is reduced, the operating speed is improved. For example, referring to FIG. 8, the power noise is relatively reduced when a decoupling capacitor is used, as compared with when no decoupling capacitor is used. As the power noise is reduced, for example, a sensing or operating speed becomes faster by 2 ns, as illustrated in FIG. 8.

Figure 3:
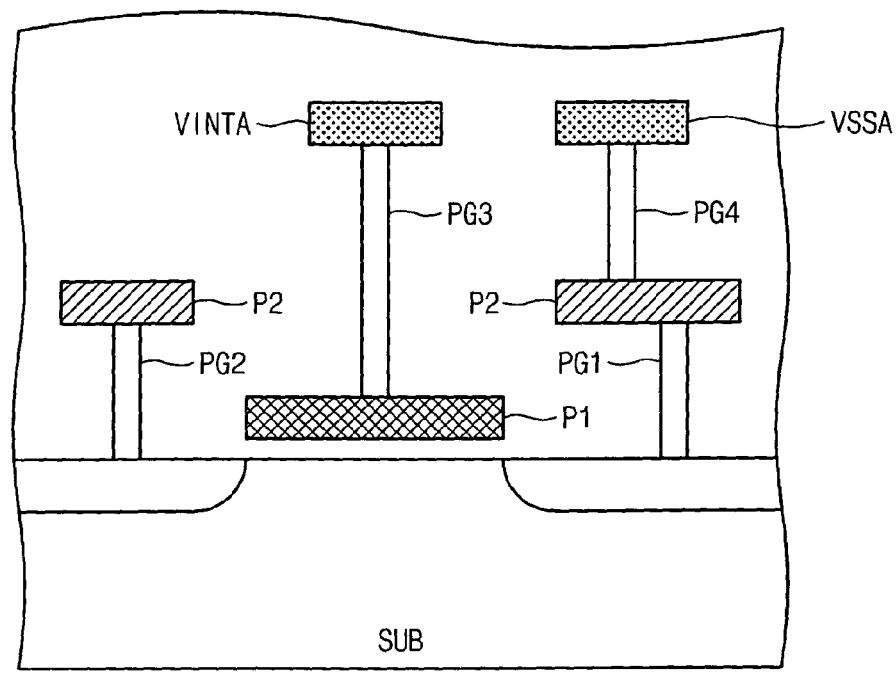
FIG. 3 is a cross-sectional view of the a dotted line A–A' shown in FIG. 2.

FIG. 3 is a cross-sectional view of the dotted line A–A' shown in FIG. 2. Referring to FIG. 3, as a means for storing charges, a decoupling capacitor comprises a polysilicon P1 forming a gate over an active region or a semiconductor substrate sub and a polysilicon P2 forming a bit line also over the active region or the semiconductor substrate sub. The polysilicon P1 is one electrode of the decoupling capacitor. The polysilicon P2 the other electrode of the decoupling capacitor. The polysilicon P2 is electrically connected to an impurity region of the active region via plugs PG1 and PG2. The polysilicon P1 is electrically connected to a voltage supply line VINTA via a plug PG3, and the polysilicon P2 is electrically connected to a voltage supply line VSSA via a plug PG4. Each plug can be formed of tungsten, polysilicon, tungsten silicide, or the like.

Figure 4:
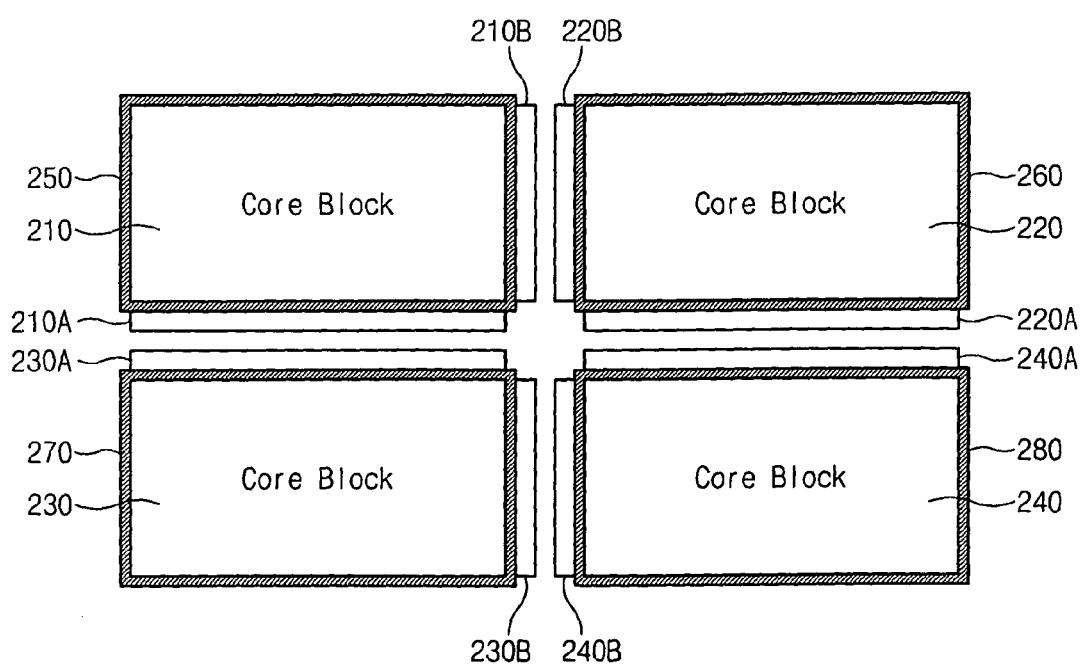
FIG. 4 is a block diagram of a semiconductor memory device according to a second embodiment of the present invention.

FIG. 4 is a block diagram of a semiconductor memory device according to a second embodiment of the present invention. Referring to FIG. 4, a semiconductor memory device 200 according to the second embodiment of the present invention includes a plurality of core blocks, e.g. core blocks 210, 220, 230 and 240, laid out in a matrix form. A row selector block is disposed at one side of a core block and a column selector block is disposed at another side thereof For example, a row selector block 210A is disposed at a bottom side of a core block 210 and a column selector block 210B is disposed at a right side thereof. A row selector block 220A is disposed at a bottom side of a core block 220 and a column selector block 220B is disposed at a left side thereof. A row selector block 230A is disposed at a top side of a core block 230 and a column selector block 230B is disposed at a right side thereof. A row selector block 240A is disposed at a top side of a core block 240 and a column selector block 240B is disposed at a left side thereof. Although not shown in FIG. 4, a peripheral circuit block may be arranged between the core blocks 210 and 220 and the core blocks 230 and 240.

As shown in FIG. 4, charge storing regions 250, 260, 270 and 280 are laid out to surround corresponding core blocks 210–240, respectively. A decoupling capacitor for preventing a power noise caused at a sensing operation is formed at respective charge storing regions 250–280. Since a charge storing region is formed along the periphery of a core block, it is possible to form a considerably large sized decoupling capacitor. As a charge storing means, the decoupling capacitor is connected to voltage supply lines for supplying operating voltages such as a power supply voltage and a ground voltage to sense amplifiers.

Figure 5:
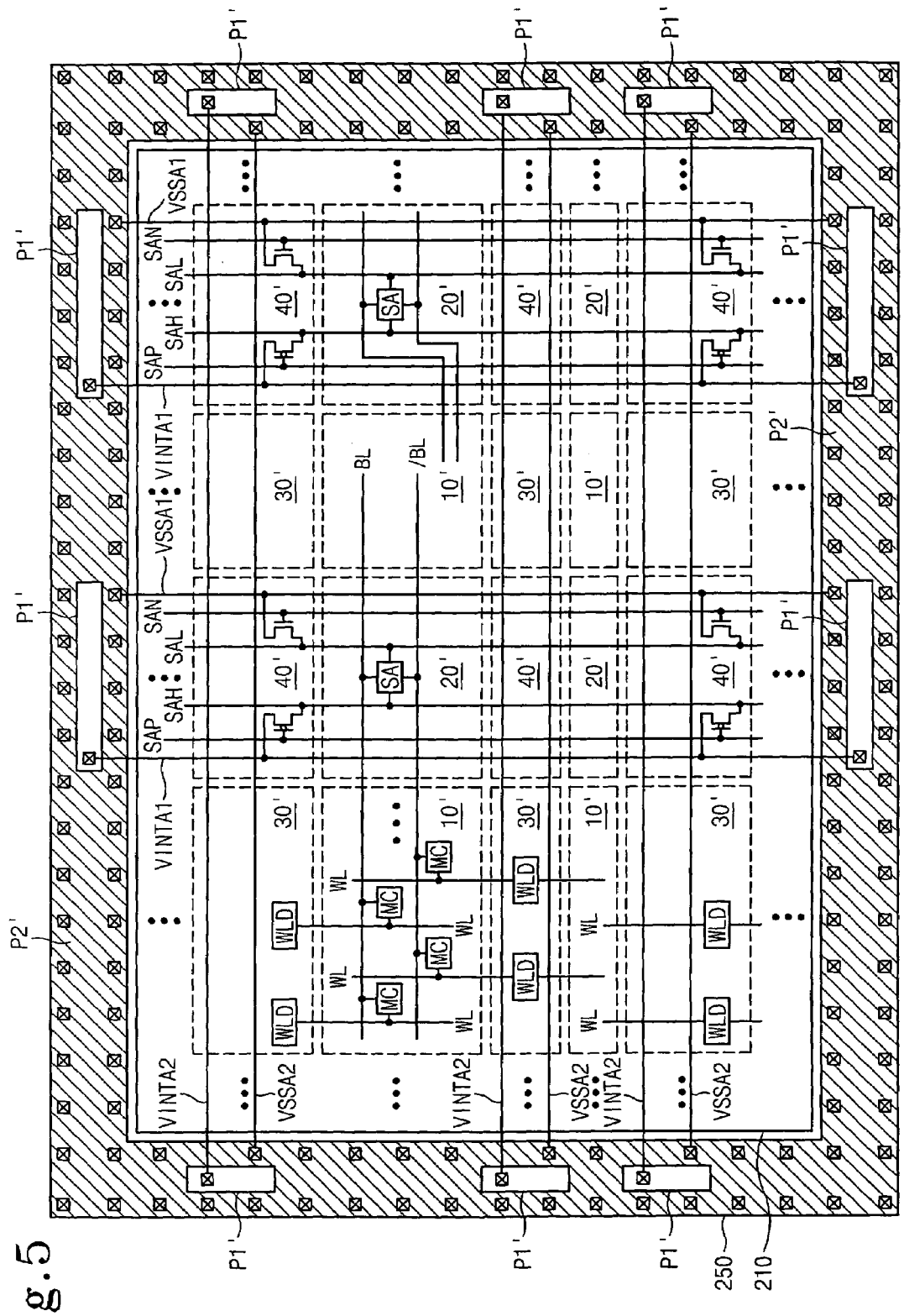
FIG. 5 is a layout diagram of the core block and the decoupling capacitor shown in FIG. 4.

FIG. 5 is a layout structure of a core block and a charge storing region shown in FIG. 4. Since core blocks in FIG. 4 have the same structure, only one core block 210 is shown in FIG. 5.

Referring to FIG. 5, a core block 210 comprises a plurality of sub-arrays 10' arranged in a matrix of rows and columns. Each sub-array 10' includes a plurality of word lines WL, a plurality of bit line pairs BL and /BL, and a plurality of memory cells MC arranged at intersections of the word lines and the bit lines. Sense amplifier regions 20' are disposed between sub-arrays 10' adjacent in each column direction. A plurality of sense amplifiers SA are provided at each sense amplifier region 20', and each sense amplifier SA is connected to bit line pairs BL and /BL, which are arranged along the same column, of each of adjacent sub-arrays. That is, sense amplifiers SA in each sense amplifier region 20' are shared by adjacent sub-arrays 10'.

Word line driving regions 30' are disposed at both sides of respective sub-arrays 10' in each row. A plurality of word line drivers WLD are provided at each word line driving region 30'. A portion of word lines in each sub-array is selected by word line drivers WLD laid out at one side. The remaining portion is selected by word line drivers WLD of a word line driving region laid out at the other side. Conjunction regions 40' are laid out between word line driving regions 30' adjacent in a column direction.

A voltage supply line VINTA1 and a voltage supply line VSSA1 are laid out over sense amplifier and conjunction regions 20' and 40' in each row. Further, a voltage supply line VINTA2 and a voltage supply line VSSA2 are laid out over word line driving and conjunction regions 30' and 40' in each column. Voltage supply lines VINTA1 arranged along a row direction are intersected with voltage supply lines VINTA2 arranged along a column direction at conjunction regions 40'. Voltage supply lines VSSA1 arranged along a row direction are intersected and interconnected with voltage supply lines VSSA2 arranged along a column direction at conjunction regions 40'. That is, the lines VINTA1, VINTA2, VSSA1 and VSSA2 are laid out to have a mesh structure.

A voltage supply line VINTA1 in each row is connected to a signal line SAH via PMOS transistors disposed at conjunction regions 40' and connected in common to a signal line SAP. A voltage supply line VSSA1 in each row is connected to a signal line SAL via NMOS transistors disposed at conjunction regions 40' and connected in common to a signal line SAN. As shown in FIG. 5, the signal lines SAH and SAL are connected to sense amplifiers SA of each sense amplifier region 20'. As described above, voltage supply lines VSSA1 arranged along a row direction are intersected and interconnected with voltage supply lines VSSA2 arranged along a column direction at conjunction regions 40'.

A decoupling capacitor is formed at a charge storing region 250 formed to surround the core block 210. The decoupling capacitor of the present invention includes an active region, first conductive films P1' formed over the active region, and a second conductive film P2' formed over the active region. In one embodiment, the first conductive films P1' are formed of a polysilicon for a gate of a MOS transistor, and the second conductive film P2' is formed of a polysilicon for a bit line. The first conductive films P1' form one electrode of the decoupling capacitor and the second conductive film P2' forms the other electrode of the decoupling capacitor. Both ends of a voltage supply line VINTA1 in each row are connected to the first conductive films P1' disposed at upper and lower sides of the core block 210 through corresponding contacts (formed between a metal and a polysilicon), respectively.

Both ends of a voltage supply line VSSA1 in each row are connected to the second conductive film P2' formed to surround the core block 210 through corresponding contacts (formed between a metal and a polysilicon), respectively. Both ends of a voltage supply line VINTA2 in each column are connected to the first conductive films P1 arranged at right-handed and left-handed sides of the core block via corresponding contacts (formed between a metal and a polysilicon). Both ends of a voltage supply line VSSA1 in each column are connected to the second conductive film P2' formed to surround the core block 210 through corresponding contacts (formed between a metal and a polysilicon), respectively. The second conductive film P2' is electrically connected to the active region via contacts (formed between a polysilicon and an active region).

A semiconductor memory device according to the second embodiment has a similar operation and attendant vantages as described earlier with the reference to a first embodiment. Description thereof is thus omitted.

Figure 6:
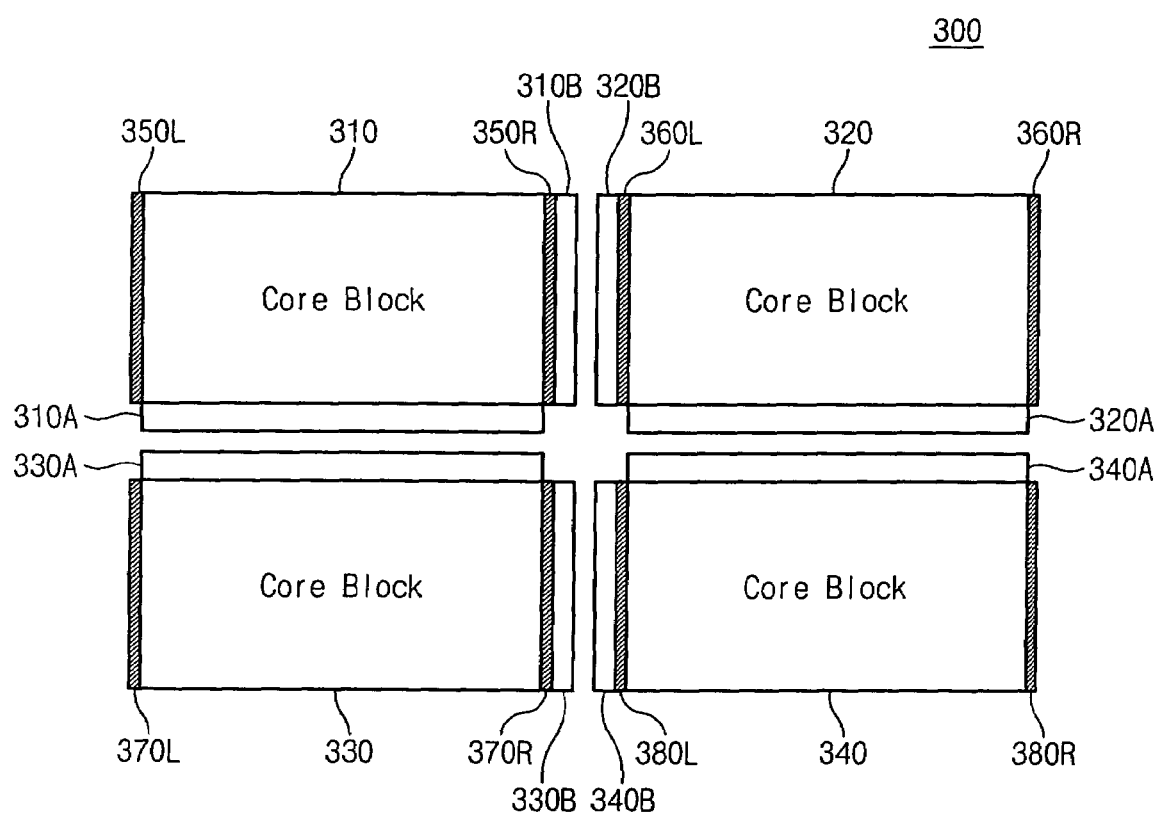
FIG. 6 is a block diagram of a semiconductor memory device according to a third embodiment of the present invention.

FIG. 6 shows a block diagram of a semiconductor memory device according to a third embodiment of the present invention.

Referring to FIG. 6, a semiconductor memory device 300 of the present invention comprises a plurality of core blocks, e.g. core blocks 310, 320, 330 and 340, arranged in a matrix shape. A row selector block is disposed at one side of a core block and a column selector block is disposed at another side thereof. For example, a row selector block 310A is disposed at a bottom side of a core block 310 and a column selector block 310B is disposed at a right side thereof. A row selector block 320A is disposed at a bottom side of a core block 320, and a column selector block 320B is disposed at a left side thereof. A row selector block 330A is disposed at a top side of a core block 330 and a column selector block 330B is disposed at a right side thereof. A row selector block 340A is disposed at a top side of a core block 340 and a column selector block 340B is disposed at a left side thereof. Although not shown in FIG. 6, a peripheral circuit block may be arranged between the core blocks 310 and 320 and the core blocks 330 and 340.

Charge storing regions are arranged at two sides, e.g., left and right sides, (that is, left-handed and right-handed sides) of each core block, respectively. For example, charge storing regions 350L and 350R are laid out at left and right sides, respectively, of core block 310.

Charge storing regions 360L and 360R are laid out at left and right sides, respectively, of the core block 320. Charge storing regions 370L and 370R are laid out at left and right sides, respectively, of the core block 330. Charge storing regions 380L and 380R are laid out at left and right sides, respectively, of the core block 340. A decoupling capacitor for preventing a power noise caused at a sensing operation is formed at each charge storing region. Since a charge storing region is formed along the side of the core block, it is possible to form a considerably large sized decoupling capacitor. As a charge storing means, a decoupling capacitor will be connected to voltage supply lines for supplying operating voltages to sense amplifiers.

Figure 7:
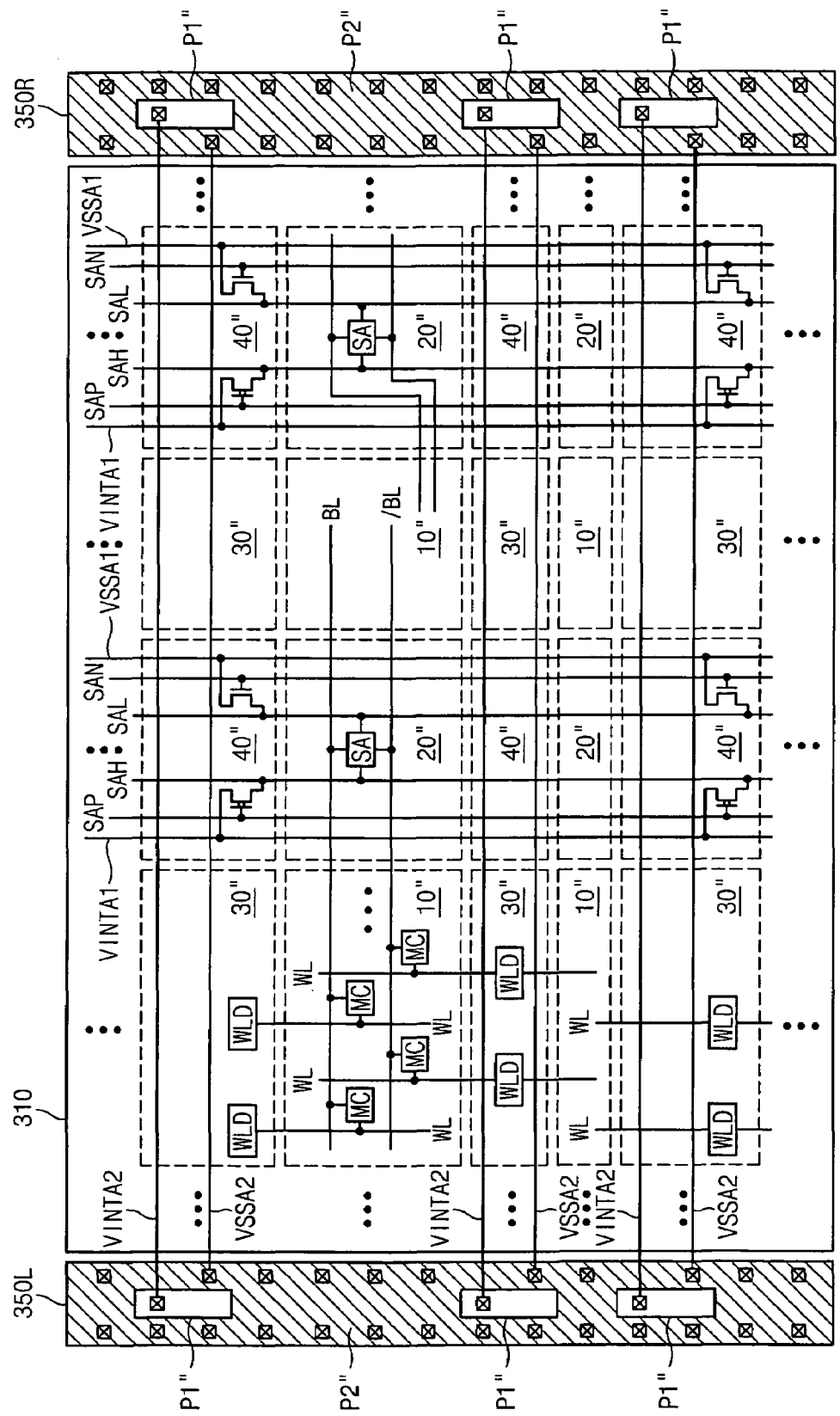
FIG. 7 is a layout diagram of the core block and the decoupling capacitor shown in FIG. 6.

FIG. 7 shows a layout structure of a core block and a charge storing region shown in FIG. 6. Since core blocks in FIG. 6 have similar structures, only one core block 310 is illustrated in FIG. 7. Further, since decoupling capacitors formed at charge storing regions disposed at left and right sides of each core block are formed similarly, only two charge storing regions 350L and 350L related to one core block 310 are shown in FIG. 7.

Referring to FIG. 7, a core block 310 comprises a plurality of sub-arrays 10" arranged in a matrix of rows and columns. Each sub-array 10" includes a plurality of word lines WL, a plurality of bit line pairs BL and /BL, and a plurality of memory cells MC arranged at intersections of the word lines and the bit lines. Sense amplifier regions 20" are disposed between sub-arrays 10" adjacent in each column direction. A plurality of sense amplifiers SA are provided at each sense amplifier region 20", and each sense amplifier SA is connected to bit line pairs BL and /BL, arranged along the same column, of each of adjacent sub-arrays. That is, sense amplifiers SA in each sense amplifier region 20" are shared by adjacent sub-arrays 10".

Continuing to refer to FIG. 7, word line driving regions 30" are disposed at both sides of respective sub-arrays 10" in each row. A plurality of word line drivers WLD are provided at each word line driving region 30". A portion of the word lines in each sub-array is selected by word line drivers WLD driving region laid out at one side. The remaining portion is selected by word line drivers WLD driving region laid out at the other side. Conjunction regions 40" are laid out between word line driving regions 30" adjacent in a column direction.

Voltage supply lines VINTA1 and VSSA1 are laid out over sense amplifier and conjunction regions 20" and 40" in each row. Voltage supply lines VINTA2 and VSSA2 are laid out over word line driving and conjunction regions 30" and 40" in each column. The voltage supply lines VINTA1 are intersected and interconnected with the voltage supply lines VINTA2 at conjunction regions 40", and the voltage supply lines VSSA1 are intersected and interconnected with the voltage supply lines VSSA2 at conjunction regions 40". The voltage supply lines VINTA1, VINTA2, VSSA1 and VSSA2 are laid out to have a mesh structure.

A voltage supply line VINTA1 in each row is connected to a signal line SAH via PMOS transistors disposed at conjunction regions 40" and connected in common to a signal line SAP. A ground voltage supply line VSSA1 in each row is connected to a signal line SAL via NMOS transistors disposed at conjunction regions 40" and are connected in common to a signal line SAN. As shown in FIG. 7, the signal lines SAH and SAL are connected to sense amplifiers SA of each sense amplifier region 20". As describe above, voltage supply lines VSSA1 disposed in a row direction are intersected and interconnected with voltage supply lines VSSA2 disposed in a column direction at conjunction regions 40".

A first end of the voltage supply line VINTA2 is connected to a charge storing region 350L on the left side of a core block 310. A second end thereof is connected to a charge storing region 350R on the right side of the core block 310. A first end of voltage supply line VSSA2 is connected to the charge storing region 350L. A second end thereof is connected to the charge storing region 350R. A decoupling capacitor is formed at each of the charge storing regions 350L and 350R.

Each decoupling capacitor includes an active region, first conductive films P1" formed over the active region, and a second conductive film P2" formed over the active region. In one embodiment, the first conductive films P1" are a polysilicon forming a gate of a MOS transistor, and the second conductive film P2" is a polysilicon forming a bit line. One end of a voltage supply line VINTA2 in each column is connected to the first conductive film P1" of the charge storing region 350L via a contact (formed between a metal and a polysilicon), and the other end thereof is connected to the first conductive film P1" of the charge storing region 350R via a contact. One end of a voltage supply line VSSA2 in each column is connected to the second conductive film P2" of the charge storing region 350L via a contact, and the other end thereof is connected to the second conductive film P2" of the charge storing region 350R via a contact. A second conductive film P2" of the charge storing region 350L is electrically connected to the active region via contacts (formed between a polysilicon and the active region). A second conductive film P2" of the charge storing region 350R is electrically connected to the active region via contacts (formed between a polysilicon and the active region).

In one embodiment, only one conductive film P1" can be formed at each charge storing region. A only one voltage supply line VINTA2 can be connected to the conductive film P1". In one embodiment, a plurality of first conductive films P1" are formed to be connected to voltage supply lines, respectively. The first conductive films P1" form one electrode of a decoupling capacitor and the second conductive film P2" forms the other electrode thereof.

A semiconductor memory device according to the third embodiment has a similar operation and attendant advantages as described earlier with reference to a first embodiment. Description thereof is thus omitted.

As set forth above, a charge storing region is provided to surround a core block or at sides (top, bottom, left or right) of a core block. It should be apparent to one of reasonable skill that a charge storing region is formed to surround a peripheral circuit block. Furthermore, a charge storing region can be formed at only one side of a core block or to surround a core block and a peripheral circuit block. Although not shown in figures, decoupling capacitors can be formed at a conjunction and word line driving regions.

The invention has been described using exemplary preferred embodiments. It is to be understood, however, that the scope of the invention is not limited to the disclosed embodiment. The description is intended to cover various modifications and similar arrangements. The scope of the claims, therefore, should be accorded the broadest interpretation so as to encompass all such modifications and similar arrangements.

What is claimed is:

1. A semiconductor memory device, comprising:
a core block including a plurality of sub-arrays and a plurality of sense amplifier regions;
a plurality of first voltage supply lines capable of supplying a first operating voltage to the plurality of sense amplifier regions;
a plurality of second voltage supply lines capable of supplying a second operating voltage to the sense amplifier regions; and
a first charge storing region arranged at one side of the core block and including first charge storing means connected to the first and second voltage supply lines; and
a second charge storing region distinct from the first storing region arranged at an opposite side of the one side and including second charge storing means connected to the first and second voltage supply lines.

2. The memory device of claim 1 where a sense amplifier is formed at each of the sense amplifier regions, the sense amplifiers being supplied with the first and second operating voltages.

3. The memory device of claim 1 where the first and second charge storing means comprises first and second decoupling capacitors capable of preventing a power noise.

4. The memory device of claim 3 where the first and second decoupling capacitors each comprises:
an active region formed at one side of the core block;
a plurality of first conductive films formed over the active region and connected to corresponding first voltage supply lines; and
a second conductive film formed over the active region and connected to the second voltage supply lines;
where the second conductive film is electrically connected to the active region through a plurality of contacts.

5. The memory device of claim 4
where the plurality of first conductive films is a polysilicon forming a gate; and
where the second conductive film is a polysilicon forming a bit line.

6. A semiconductor memory device comprising:
a core block including a plurality of sub-arrays arranged in rows and columns and a plurality of sense amplifier regions each arranged between sub-arrays;
a plurality of first voltage supply lines capable of supplying a first operating voltage to the sense amplifier regions;
a plurality of second voltage supply lines capable of supplying a second operating voltage to the sense amplifier regions; and
a first charge storing region disposed at one side of the core block, the first charge storing region capable of connecting to the first supply lines;

a second charge storing region disposed at another side of the core block different than the one side, the second charge storing region capable of connecting to the second supply lines.

7. The memory device of claim 6
where a plurality of sense amplifiers are formed at each of the sense amplifier regions, the sense amplifiers being supplied with the first and second operating voltages.

8. The memory device of claim 6
where the first charge storing region comprises a first decoupling capacitor; and
where the second charge storing region comprises a second decoupling capacitor.

9. The memory device of claim 8 where the first decoupling capacitor comprises:
a first active region formed at the one side of the core block;
a plurality of first conductive films formed over the first active region and capable of connecting to the first voltage supply lines; and
a second conductive film formed over the first active region and capable of connecting to the second voltage supply lines;
where the second conductive film is capable of electrically connecting to the first active region through a plurality of contacts.

10. The memory device of claim 9 where the second decoupling capacitor comprises:
a second active region formed at the another side of the core block;
a plurality of third conductive films formed over the second active region and capable of connecting to corresponding first voltage supply lines; and
a fourth conductive film formed over the second active region and capable of connecting to the second voltage supply lines;
where the fourth conductive film is capable of electrically connecting to the second active region through a plurality of contacts.

11. The memory device of claim 10 comprising a row selector circuit disposed adjacent to a side of the core block.

12. The memory device of claim 10 comprising a column selector circuit disposed adjacent to a side of the core block.

13. The memory device of claim 10
where the first conductive films are a polysilicon material that form a gate; and
where the second conductive film is a polysilicon material that forms a bit line.

14. A semiconductor memory device, comprising:
a core block including a plurality of sub-arrays arranged in rows and columns, a plurality of word line driving regions disposed between sub-arrays adjacent in a row direction, a plurality of sense amplifier regions each arranged between sub-arrays adjacent in a column direction, and a plurality of conjunction regions disposed between sense amplifier regions adjacent in the row direction;
a plurality of first voltage supply lines disposed on sense amplifier and conjunction regions, capable of supplying a first operating voltage to the sense amplifier regions;
a plurality of second voltage supply lines disposed on sense amplifier and conjunction regions, capable of supplying a second operating voltage to the sense amplifier regions; and
first and second charge storing regions respectively disposed at opposing sides of the core block;

where the first and second charge storing regions comprise first and second charge storing regions capable of connecting to first and second voltage supply lines, respectively.

15. The memory device of claim 14 where the sense amplifier regions include a plurality of sense amplifiers, the sense amplifiers being capable of receiving the first and second operating voltages.

16. The memory device of claim 15 where the first charge storing means comprises:
   a first decoupling capacitor including a first active region formed at one side of the core block;
   a plurality of first conductive films formed over the first active region and capable of connecting to the first voltage supply lines, respectively; and
   a second conductive film formed over the first active region and capable of connecting to the second voltage supply lines;
   where the second conductive film is capable of electrically connecting to the first active region through a first plurality of contacts.

17. The memory device of claim 16 where the second charge storing means comprises:
   a second decoupling capacitor including a second active region formed at another side of the core block;
   a plurality of third conductive films formed over the second active region and capable of connecting to the first voltage supply lines; and
   a fourth conductive film formed over the second active region and capable of connecting to the second voltage supply lines;
   where the fourth conductive film is capable of electrically connecting to the second active region through a second plurality of contacts.

18. The memory device according to claim 17 comprising a row selector circuit disposed adjacent to the one side of the core block.

19. The memory device of claim 14 comprising:
   a plurality of third voltage supply lines disposed on sense amplifier and word line driving regions, capable of supplying the first operating voltage to the sense amplifiers;
   a plurality of fourth voltage supply lines disposed on sense amplifier and word line driving regions, capable of supplying the second operating voltage to the sense amplifiers.

20. The memory device of claim 19 where the first and third voltage supply lines are intersected and interconnected at the conjunction regions; and
   where the second and fourth voltage supply lines are intersected and interconnected at the conjunction regions.

21. The memory device of claim 20 comprising third and fourth charge storing means connected to the third and fourth voltage supply lines, respectively.

22. The memory device of claim 21 where the third and fourth charge storing means are disposed at other opposing sides of the core block different than the opposing sides.

23. A memory device, comprising:
   a core block including a plurality of sub-arrays arranged in rows and columns, a plurality of word line driving regions disposed between sub-arrays adjacent in a row direction, a plurality of sense amplifier regions each arranged between sub-arrays adjacent in a column direction, and a plurality of conjunction regions disposed between sense amplifier regions adjacent in the row direction;
   a plurality of first voltage supply lines disposed on sense amplifier and conjunction regions, capable of supplying a first operating voltage to the sense amplifier regions;
   a plurality of second voltage supply lines disposed on sense amplifier and conjunction regions, capable of supplying a second operating voltage to the sense amplifier regions;
   first and second charge storing regions disposed at sides of the core block;
   a column selector block disposed adjacent to the other sides of the core block;
   a plurality of third voltage supply lines disposed on sense amplifier and word line driving regions, capable of supplying the first operating voltage to sense amplifiers;
   a plurality of fourth voltage supply lines disposed on sense amplifier and word line driving regions, capable of supplying the second operating voltage to the sense amplifiers; and
   third and fourth charge storing means connected to the third and fourth voltage supply lines, respectively;
   where the first and third voltage supply lines are intersected and interconnected at the conjunction regions;
   where the second and fourth voltage supply lines are intersected and interconnected at the conjunction regions;
   where the first and second charge storing regions comprise first and second charge storing regions capable of connecting to first and second voltage supply lines, respectively; and
   where the third and fourth charge storing means are disposed at other sides of the core block.

24. A memory device, comprising:
   a core block including a plurality of sub-arrays arranged in rows and columns, a plurality of word line driving regions disposed between sub-arrays adjacent in a row direction, a plurality of sense amplifier regions each arranged between sub-arrays adjacent in a column direction, and a plurality of conjunction regions disposed between sense amplifier regions adjacent in the row direction;
   a plurality of first voltage supply lines disposed on sense amplifier and conjunction regions, capable of supplying a first operating voltage to the sense amplifier regions;
   a plurality of second voltage supply lines disposed on sense amplifier and conjunction regions, capable of supplying a second operating voltage to the sense amplifier regions;
   first and second charge storing regions disposed at sides of the core block;
   a plurality of third voltage supply lines disposed on sense amplifier and word line driving regions, capable of supplying the first operating voltage to sense amplifiers;
   a plurality of fourth voltage supply lines disposed on sense amplifier and word line driving regions, capable of supplying the second operating voltage to the sense amplifiers; and
   third and fourth charge storing means connected to third and fourth voltage supply lines, respectively;
   where the first and third voltage supply lines are intersected and interconnected at the conjunction regions;

where the second and fourth voltage supply lines are intersected and interconnected at the conjunction regions;

where the first and second charge storing regions comprise first and second charge storing regions capable of connecting to first and second voltage supply lines, respectively;

where the third and fourth charge storing means are disposed at other sides of the core block; and where the third charge storing means comprises:

a third decoupling capacitor including a third active region formed at a third side of the core block;

a plurality of fifth conductive films formed over the third active region and capable of connecting to the third voltage supply lines; and a sixth conductive film formed over the third active region and connected to the fourth voltage supply lines;

where the sixth conductive film is capable of electrically connecting to the third active region through a third plurality of contacts.

25. The memory device of claim 24 where the second charge storing means comprises:

a fourth decoupling capacitor including a fourth active region formed at a fourth side of the core block;

a plurality of seventh conductive films formed over the fourth active region and capable of electrically connecting to the first voltage supply lines; and an eighth conductive film formed over the fourth active region and capable of electrically connecting to the second voltage supply line;

where the eighth conductive film is capable of electrically connecting to the fourth active region through a fourth plurality of contacts.

26. A semiconductor memory device, comprising:

a core block including a plurality of sub-arrays arranged in rows and columns, a plurality of word line driving regions disposed between sub-arrays adjacent in a row direction, a plurality of sense amplifier regions each arranged between sub-arrays adjacent in a column direction, and a plurality of conjunction regions disposed between sense amplifier regions adjacent in the row direction;

a plurality of first voltage supply lines disposed on sense amplifier and conjunction regions, capable of supplying a first operating voltage to the sense amplifier regions;

a plurality of second voltage supply lines disposed on sense amplifier and conjunction regions, capable of supplying a second operating voltage to the sense amplifier regions; and first and second charge storing regions disposed at sides of the core block;

where the first and second charge storing regions comprise first and second charge storing regions capable of connecting to first and second voltage supply lines, respectively;

where the first operating voltage is a supply voltage and the second operating voltage is a ground voltage.

27. A semiconductor memory device, comprising:

a core block including a plurality of sub-arrays, a plurality of word line driving regions disposed between sub-arrays, a plurality of sense amplifier regions each arranged between sub-arrays, each sense amplifier regions having a plurality of sense amplifiers, and a plurality of conjunction regions each disposed between sense amplifier regions;

a plurality of first voltage supply lines disposed on sense amplifier and conjunction regions, capable of supplying a first operating voltage to the sense amplifier regions;

a plurality of second voltage supply lines disposed on sense amplifier and conjunction regions, capable of supplying a second operating voltage to the sense amplifier regions;

a plurality of third voltage supply lines disposed on sense amplifier and conjunction regions, capable of supplying the first operating voltage to sense amplifier regions;

a plurality of fourth voltage supply lines disposed on sense amplifier and conjunction regions, capable of supplying the second operating voltage to the sense amplifier regions; and a charge storing region arranged to surround the core region and comprising charge storing means connected to the first, second, third, and fourth voltage supply lines.

28. The memory device of claim 27 where the first and third voltage supply lines are intersected and interconnected at the conjunction regions; and where the second and fourth voltage supply lines are intersected and interconnected at the conjunction regions.

29. The memory device of claim 27 where the charge storing means comprises a decoupling capacitor capable of preventing a power noise caused at a sensing operation.

30. The memory device of claim 29 where the decoupling capacitor comprises:

an active region formed to surround the core block;

a plurality of first conductive films formed over the active region and connected to the first and third voltage supply lines; and a second conductive film formed over the active region and connected to the second and fourth voltage supply lines;

where the second conductive film is capable of electrically connecting to the active region through a plurality of contacts.

31. A semiconductor memory device, comprising:

a core block including a plurality of sub-arrays arranged in rows and columns and a plurality of sense amplifier regions each arranged between sub-arrays adjacent in a column direction;

first and second charge storing regions disposed at a first and second sides, respectively, of the core block, first and second decoupling capacitors being formed at the first and second charge storing regions, respectively;

a plurality of first voltage supply lines connected to first electrodes of the first and second decoupling capacitors, the plurality of first voltage supply lines being capable of supplying a first operating voltage to the sense amplifier regions; and a plurality of second voltage supply lines connected to second electrodes of the first and second decoupling capacitors, the plurality of second voltage supply lines being capable of supplying a second operating voltage to the sense amplifier regions.

32. The memory device of claim 31 where the first electrodes of the first and second decoupling capacitors comprises a plurality of conductive films connected to the first voltage supply lines.

33. The memory device of claim 31 where the second electrodes of the first and second decoupling capacitors comprises a plurality of conductive films connected to the second voltage supply lines.

34. A semiconductor memory device comprising:
a core block including a plurality of sub-arrays arranged in rows and columns, a plurality of word line driving regions disposed between adjacent sub-arrays, a plurality of sense amplifier regions each arranged between adjacent sub-arrays, and a plurality of conjunction regions each disposed between the sense amplifier regions;
a plurality of first voltage supply lines disposed on sense amplifier and conjunction regions;
a plurality of second voltage supply lines disposed on the sense amplifier and conjunction regions;
a plurality of third voltage supply lines disposed on sense amplifier and word line driving regions;
a plurality of fourth voltage supply lines disposed on the sense amplifier and word line driving regions; and
a charge storing region disposed to surround the core block and having a decoupling capacitor capable of storing a charge;
where the first and third voltage supply lines are connected to the one electrode and the second and fourth voltage supply lines are connected to the another electrode.

35. The memory device of claim 34
where the first and third voltage supply lines supply a voltage supply voltage to the sense amplifier regions; and
where the second and fourth voltage supply lines supply a ground voltage to the sense amplifier regions.

36. A semiconductor memory device, comprising:
a core block including a plurality of sub-arrays arranged in rows and columns, a plurality of word line driving regions disposed between adjacent sub-arrays adjacent, a plurality of sense amplifier regions each arranged between adjacent sub-arrays, and a plurality of conjunction regions each disposed between adjacent sense amplifier regions;
a plurality of first voltage supply lines disposed on sense amplifier and conjunction regions;
a plurality of second voltage supply lines disposed on the sense amplifier and conjunction regions;
a plurality of third voltage supply lines disposed on sense amplifier and word line driving regions;
a plurality of fourth voltage supply lines disposed on the sense amplifier and word line driving regions; and
first and second charge storing regions disposed respectively at two sides of the core block and including first and second decoupling capacitors, respectively;
where the third voltage supply lines are connected to first electrodes of the first and second decoupling capacitors and the fourth voltage supply lines are connected to second electrodes of the first and second decoupling capacitor.

37. The memory device of claim 36
where the first and third voltage supply lines are intersected and interconnected at the conjunction regions; and
where the second and fourth voltage supply lines are intersected and interconnected at the conjunction regions.

38. The memory device of claim 36 where the first electrodes of the first and second decoupling capacitors comprises a plurality of conductive films connected to the third voltage supply lines.

39. The memory device of claim 36 where the second electrodes of the first and second decoupling capacitors comprises a plurality of conductive films connected to the fourth voltage supply lines.

40. The memory device of claim 23 where the sense amplifiers are adapted to receive the first and second operating voltages.

41. The memory device of claim 24 where the sense amplifiers are adapted to receive the first and second operating voltages.

42. The memory device of claim 26 where the sense amplifier regions include a plurality of sense amplifiers to receive the first and second operating voltages.

* * * * *

UNITED STATES PATENT AND TRADEMARK OFFICE
CERTIFICATE OF CORRECTION

PATENT NO. : 7,002,872 B2 Page 1 of 1
APPLICATION NO. : 10/676996
DATED : February 21, 2006
INVENTOR(S) : Hwang et al.

It is certified that error appears in the above-identified patent and that said Letters Patent is hereby corrected as shown below:

Column 5, line 16, please replace "thereof For" with --thereof. For--
Column 14, line 49, please replace "disposed at a first" with --disposed at first--

Signed and Sealed this

Thirtieth Day of January, 2007

JON W. DUDAS
*Director of the United States Patent and Trademark Office*